US006432541B1

(12) United States Patent
Gan

(10) Patent No.: US 6,432,541 B1
(45) Date of Patent: Aug. 13, 2002

(54) RESIN COMPOSITION OF POLYEPOXIDE AND POLYISOCYANATE, PREPREG, AND METALLIC FOIL LAMINATE

(75) Inventor: Joseph Gan, Strasbourg (FR)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 09/458,379

(22) Filed: Dec. 10, 1999

(30) Foreign Application Priority Data

Dec. 11, 1998 (GB) .............................................. 9827367

(51) Int. Cl.$^7$ ......................... B32B 27/38; B32B 15/08; B32B 31/26; C08L 63/00; C08G 18/81
(52) U.S. Cl. ....................... 428/416; 428/413; 428/414; 428/901; 427/386; 156/307.3; 156/307.7; 525/113; 525/528; 528/45; 528/52
(58) Field of Search ................................. 428/413, 414, 428/416, 901; 528/51, 52, 73, 45; 525/113, 528; 516/307.3, 307.7; 427/386

(56) References Cited

U.S. PATENT DOCUMENTS

| | | | |
|---|---|---|---|
| 3,334,110 A | | 8/1967 | Schramm |
| 4,066,628 A | | 1/1978 | Ashida et al. |
| 4,070,416 A | | 1/1978 | Narahara et al. |
| 4,401,499 A | * | 8/1983 | Kaneko et al. .......... 156/307.1 |
| 4,564,651 A | | 1/1986 | Markert et al. |
| 4,631,306 A | | 12/1986 | Markert et al. |
| 5,066,735 A | | 11/1991 | Walker et al. |
| 5,071,520 A | | 12/1991 | Lin et al. |
| 5,112,932 A | | 5/1992 | Koenig et al. |
| 5,314,720 A | | 5/1994 | Gan et al. |
| 5,387,495 A | | 2/1995 | Lee et al. |
| 5,449,737 A | | 9/1995 | Uchida et al. |
| 5,545,697 A | | 8/1996 | Uchida |

FOREIGN PATENT DOCUMENTS

| | | |
|---|---|---|
| EP | 0 113 575 A1 | 7/1984 |
| EP | 0 133 575 A1 | 2/1985 |
| EP | 0 318 325 A2 | 5/1989 |
| EP | 0 695 316 | 12/1997 |
| GB | 1037895 | 8/1966 |
| GB | 1042855 A | 9/1966 |
| GB | 1370782 A | 10/1974 |
| JP | 61118246 | 6/1986 |
| JP | 61118247 | 6/1986 |
| WO | 94/11415 | 5/1994 |
| WO | 95/21879 | 8/1995 |
| WO | 96/12751 | 5/1996 |
| WO | 98/01041 | 1/1998 |
| WO | 98/44017 | 10/1998 |

OTHER PUBLICATIONS

Lee, et al., *Handbook of Epoxy Resins*, McGraw–Hill Book Company, NY (1967) Cover Page Only.
"Viscosity Modifier for Themosetting Resin Composition", filed in the United Kingdom on Aug. 14, 1998, Application Ser. No. 9817799.1; Applicant: Dow Deutschland, Inc.
Delmonte, et al., "Fiber–Reinforced Eposy Composites", Eposy Resin Chemistry and Technology, $2^{nd}$ Ed., pp. 885–928, (1998).
Mika, et al., "Curing Agents and Modifiers", C.A. Epoxy Resins, $2^{nd}$ Ed., pp. 465–512, (1988).
Lee, et al., "Synthesis of Glycidyl—Type Epoxy Resins", Handbook of Epoxy Resins , pp. 2–1 to 3–24, (1967).
"Epoxy Resins", Encyclopedia of Poly. Sci. & Eng., vol. 6, pp. 348–356, (1986).
WPI Abstract Accession No. 80–19359[11] & JP 550015870 A (Toho Beslon) Feb. 4, 1980 see abstract.
WPI Abstract Accession No. 95–299775[39] & JP 070197000 A (Shinetsu) Aug. 1, 1995 see abstract.
WPI Abstract Accession No. 89–319250[44] & JP 010236226 A (Sumitomo Bakelite) Sep. 21, 1989 see abstract.
WPI Abstract Accession No. 94–198587[24] & SU 1807059 A1 (Lengd Elektrosila) Apr. 7, 1993 see abstract.
WPI Abstract Accession No. 97–347515[24] & JP 090143244 A (Mitsubishi Rayon) Jun. 3, 1997 see abstract.
WPI Abstract Accession No. 93–309237[44] & JP 050222160 A (CIBA Geigy) Aug. 31, 1993 see abstract.

* cited by examiner

*Primary Examiner*—Robert Dawson
*Assistant Examiner*—Michael J. Feely

(57) ABSTRACT

A resin composition including from about 1 to about 100 weight percent of a thermoplastic oxazolidone ring-containing compound having a molecular weight of at least 5000, which is the reaction product of:

a) from about 20 to about 43 weight percent, based on the polyepoxide and polyisocyanate reactants, of a polyisocyanate having an isocyanate-functionality of from about 1.8 to about 2.2;

b) from about 80 to about 57 weight percent, based on the polyepoxide and polyisocyanate reactants, of a polyepoxide having an epoxide functionality of from about 1.8 to about 2.2; and optionally, c) a chain extender.

The resin composition is used as an adhesive to adhere a copper foil to a prepreg or a laminate, with improved peel strength and Tg.

21 Claims, No Drawings

RESIN COMPOSITION OF POLYEPOXIDE AND POLYISOCYANATE, PREPREG, AND METALLIC FOIL LAMINATE

BACKGROUND OF THE INVENTION

This invention relates to resin formulations which are useful as adhesives and in particular to resin formulations useful for adhering metallic surfaces such as copper foil to resin laminates. More particularly, the invention relates to resin formulations useful for making prepregs, resin coated copper foils, films and electrical laminates for rigid or flexible printed wiring boards (PWB). Prepregs are resin-impregnated or resin-coated cloths or sheets, which have been subjected to a preliminary cross-linking step (known as B-staging), usually prior to the lamination of a number of pre-pregs to produce a final laminate.

There is an increasing tendency toward the miniaturization of integrated circuits in the electronic industry. The industry has for some time been seeking to produce circuit boards which permit high density mounting, in order to enable maximum miniaturization of the devices. In order to achieve higher and higher density, it is desirable that the adhesion between the conductive metal tracks and the dielectric materials is improved, that the glass transition temperature (Tg) of the dielectric material is increased, and that the dielectric constant of the dielectric constant should be smaller.

The miniaturization of circuit boards requires the use of relatively recent design techniques, in which the interconnections between logic devices are routed using so-called Build Up Multilayers (BUM). There are many different technological approaches to achieving build-up multilayers.

SUMMARY OF THE INVENTION

One approach is as described in U.S. Pat. No. 5,387,495 and involves a process in which, beginning with a solidified layer of the dielectric disposed upon a substrate, alternate layers of conducting metal and dielectric are sequentially deposited. Each layer of conducting metal tracks is defined using photoresist and a photolithographic technique. After the tracks are deposited, the photoresist is removed and a second layer of photoresist is employed to define the conductive posts which function as through holes between different layers. After each layer of conductive tracks and posts is formed, and the photoresist is removed, the dielectric is flowed into place and solidified to insulate adjacent metal tracks and posts. The process may be repeated as many times as necessary to build up layers of conducting metal and dielectric, and form the completed multilayer wiring board.

Another approach, as described in JP 61118246 A2 and in JP 6118247 A2, includes the coating of copper foil with thermosetting resin and then attaching the coated side to a prepreg or a core laminate by laminating under heat and pressure. The conducting metal tracks are defined using a photoresist and a photolithographic technique. After the tracks are deposited, the photoresist is removed and holes are made by laser or plasma drilling. The tracks are further metalized, for example, by standard electroless copper-plating, or by electrolytic plating and etching. The outer layer pattern is formed and the process may be repeated as many times as necessary to build up layers of conducting metal and dielectric, and form the completed multilayer wiring board.

The laminate employed is generally fiberglass-reinforced brominated epoxy (known as Fire Retardant laminate FR-4 grade having a Tg of about 130° C. to about 135° C.) deposited upon a dielectric carrier layer through the use of heat and pressure upon lamination.

Copper foil surfaces or copper based alloy materials are frequently treated by various processes physically or chemically to improve the peel strength of copper and copper based alloy materials on the laminate or dielectric carrier layer by the use of heat and pressure upon lamination, for example, as described in U.S. Pat. No. 5,071,520. The treated copper foils are particularly needed for the high glass transition laminates in order to achieve sufficient peel strength.

One method of improving the peel strength of copper foils involves coating the surface of the copper foil with a thermosetting resin composition comprising a brominated epoxy resin grade, a cross-linker such as dicyandiamide or a multi-functional phenolic hardener and a catalyst. The coated surface is frequently brittle and can crack easily after B-staging, because the B-staged resin layer has a low molecular weight. It is also difficult to control the thickness of the B-staged resin layer during the lamination process because the melt viscosity of the B-staged material is too low. If the degree of B-staging is raised in order to obtain higher melt viscosity, the processing window during the final lamination becomes too small and as a consequence, there is insufficient time for the resin flow to fill up the gaps between the metallic tracks.

To achieve consistent dielectric thickness control, the copper foil is usually coated first with a layer of material which has been pre-cross-linked to a relatively high degree (a so-called C-staged resin layer) and followed by a second layer of material with a lower degree of pre-cross-linking (the B-staged resin layer) in order that the resulting resin flows adequately and fills the circuit tracks. The use of the C-staged resin layer is effective to ensure the minimum thickness of the dielectric layer between two adjacent layers of conducting metal tracks. However, the 2-layer coating process is time consuming and costly.

It would be very desirable therefore to provide a coating system which would allow the coating of copper foil with two layers, or if possible one layer of an adhesive coating in order to achieve one or more of the following:

a) Improved peel strength on the circuit boards after bonding.
b) Improved formability and flexibility of the coated copper foils.
c) An improved processing window so that the coating adhesive has sufficient time to flow and fill the circuit tracks whilst at the same time providing good control over the coating thickness.
d) A Tg>135° C. for the cured adhesive so that it is at least equal to the Tg of the standard FR-4 laminates.
e) A dielectric constant of the cured adhesive which is lower than 3, in order to permit a high density of conductive tracks.

It is known to incorporate thermoplastic resins in resins used to coat the copper foil to increase the flexibility/formability of the coated film and to reduce the waste resin flow-out and thereby provide better film thickness by increasing the melt viscosity of the B-staged materials produced from the coated film. A high molecular weight polymer used for this purpose is sold commercially by Phenoxy Associates (USA), under the Trademark PKHH. This material is frequently used to reduce resin flow-out by increasing the melt viscosity of the B-staged materials without shortening the gel time. However, when PKHH is used, the Tg of the resulting laminate is adversely affected because PKHH has a Tg of around 90° C. to 95° C. Also, PKHH contains a high level of polar hydroxyl groups which increases the dielectric constant of the resin systems.

There are three types of end-products (conventionally referred to as polyoxazolidones) which can be obtained in the condensation reaction of polyisocyanates with polyfunctional epoxides, namely isocyanate-terminated polyoxazolidones, linear polyoxazolidones, and epoxy-terminated polyoxazolidones. These three possible end-products, and various methods for their production, are described in U.S. Pat. No. 5,112,932. Epoxy-terminated polyoxazolidones are prepared by reacting an epoxy resin with a polyisocyanate compound using stoichiometric excess of epoxy resin (isocyanate/epoxide ratio lower than 1).

U.S. Pat. No. 4,070,416 describes a process for producing thermosetting resins by mixing one equivalent or more of polyfunctional isocyanate per equivalent of a polyfunctional epoxide in the presence of a tertiary amine, morpholine derivatives or imidazole as catalysts. The catalyst is used within a range of about 0.1 to about 2 weight percent, based on the combined weight of the reactants. The reaction temperature of 130° C. or lower is said to result in the formation of mainly isocyanurate rings, whereas it is assumed that oxazolidone rings should be mainly formed at a temperature above 130° C. The resins produced are said to exhibit excellent electrical and mechanical properties and high thermal stability. The thermosetting resins described in U.S. Pat. No. 4,070,416 are said to be useful in various resin applications such as, heat-resistant insulation varnishes, casting resins, impregnation resins, molding resins for electrical parts, adhesives, resins for laminating boards, and resins for printed circuit boards.

EP A 0113575 discloses powder coating compositions comprising epoxy-terminated polyoxazolidone resins prepared by reacting a diepoxide and a diisocyanate in amounts which provide a ratio of epoxide equivalents to isocyanate equivalents of from about 1.1:1 to about 10:1, together with curing agents. The polyoxazolidone resins are said to have comparatively high glass transition temperatures and provide coatings with improved resistance to cathodic disbandment. The coating composition are applied by fluidized bed sintering or electrostatic spray methods.

Self-thermosetting compositions of polyisocyanates and polyepoxides are described in U.S. Pat. No. 4,564,651 and U.S. Pat. No. 4,631,306 which disclose a method for the preparation of reaction resin molded materials and molded materials for insulating components, respectively. The self-thermosetting compositions contain oxazolidone and isocyanurate rings and are prepared by mixing a polyepoxide and a polyisocyanate to form a resin mixture having a viscosity up to 7000 mpa·s at 25° C., and a mole ratio of epoxy to isocyanate groups of about 1:1 to about 5:1. The materials are prepared by reacting the resin mixture in the presence of an imidazole or tertiary amine catalyst at a temperature of from about 80° C. to about 130° C. to form a cross-linked polymer, and heating the cross-linked polymer to about 130° C. to about 200° C. to cause post-hardening and produce a molded material. The molded materials are reported to exhibit improved mechanical properties.

U.S. Pat. No. 3,334,110 discloses a method for preparing epoxy-terminated polyoxazolidones by reacting a polyisocyanate with a polyepoxide in the presence of a catalyst mixture comprising an alcohol and tertiary amine or a quaternary ammonium salt. The epoxy-terminated polyoxazolidones can be cured with epoxy curing catalysts or reacted with epoxy hardeners to give a variety of products useful in the fields of coatings, laminating, bonding, molding, and foams.

U.S. Pat. No. 4,066,628 discloses a process for preparing polyoxazolidones by reacting an organic isocyanate with an epoxide in the presence of dialkyl zinc, zinc carboxylate, organozinc chelate compound or trialkyl aluminum as the catalyst. Polyoxazolidones prepared by this process are useful starting materials for the manufacture of a wide variety of products including foams, coatings, adhesives, and elastomers.

EP B 0695316 and U.S. Pat. No. 5,449,737 also disclose the preparation of oxazolidone-containing base resins.

British Patent Application No. GB 9817799.1, filed Sep. 14, 1998, describes the use of high molecular weight epoxy-terminated polyoxazolidone-containing compounds as viscosity modifying additives which are added in relatively small amounts to other resin compositions, in particular to heat-curable thermosetting resins such as epoxy resins, in order to improve the thermosetting resins' viscosity properties, while maintaining an adequate Tg in the final cured resin.

Although numerous processes for the preparation of polyoxazolidones have heretofore been described, there is no disclosure nor suggestion in the known art that epoxy-terminated polyoxazolidones (particularly high molecular weight epoxy-terminated polyoxazolidones) would be useful, alone or in combination with other resins, as an adhesive for metal foils, such as copper foils, to improve the peel strength of copper-clad laminates.

DETAILED DESCRIPTION OF THE INVENTION

In a first aspect of the present invention, there is provided the use as an adhesive for a metallic foil of a resin composition comprising from about 1 to about 100 weight percent of a thermoplastic oxazolidone ring-containing compound having a molecular weight of at least 5000, which is the reaction product of:
  a) from about 20 to about 43 weight percent, based on the polyepoxide and polyisocyanate reactants, of a polyisocyanate having an isocyanate functionality of from about 1.8 to about 2.2; and
  b) from about 80 to about 57 weight percent, based on the polyepoxide and polyisocyanate reactants, of a polyepoxide having an epoxide-functionality of from about 1.8 to about 2.2; and optionally
  c) a chain extender.

In a second aspect of the present invention, there is provided a method of adhering a metallic foil to a laminate, which said method comprises employing as an adhesive a resin composition as defined above.

The resin composition may be used as an adhesive by coating it onto a metallic foil, for example, a copper foil, in preparation for bonding the foil to a core laminate by heat and pressure. Accordingly, in a further aspect of the invention, there is provided a metallic foil having an adhesive coating of a resin composition as defined above.

Alternatively, the resin composition may be used as an adhesive by incorporating it into a bonding sheet, or by forming it into a thin adhesive film, to be used for bonding a metallic foil to a core laminate. Accordingly further aspects of the invention provide:
  i) a bonding sheet for use in bonding a metallic foil to a laminate, comprising a reinforcing web, for example a glass web, impregnated with a resin composition as defined above, and ii) an adhesive film for use in bonding a metallic foil to a laminate, the film comprising a resin composition as defined above.

The resins employed according to the present invention for coating foils are particularly useful for the "Build Up Multilayers" method, because in general the resins exhibit one or more of higher glass transition temperature, lower dielectric constant, higher peel strength, better formability and better processing window properties than materials proposed in the prior art. The high molecular weight epoxy-terminated polyoxazolidone-containing compounds can be extruded as film to serve as the bonding layer between the copper foil and the core laminates.

The resin compositions useful for making resin coated foils, films and prepreg bonding sheets according to the present invention may be a blend of the said high molecular weight epoxy resin containing oxazolidone rings with: from about 0 to about 99 weight percent of a thermosetting resin; from about 0 to about 99 weight percent of a thermoplastic resin; or from about 0 to about 99 weight percent of a mixture of a thermosetting resin and a thermoplastic resin.

The thermosetting resin may be, for example, a brominated epoxy resins such as those sold by The Dow Chemical Company under the Trademark D.E.R. 542, D.E.R. 592A80, D.E.R. 560 or D.E.R. 538A80.

The thermoplastic resin may be, for example, a phenoxy resin such as PKHH, brominated polystyrene, poly dibromophenylene oxide or polyphenylene oxide or a polyester.

Other inorganic fillers and additives can be included in the compositions to achieve the desired properties.

The polyepoxide compound useful in the preparation of the coating resin is preferably a compound which possesses an average of from about 1.8 to about 2.2, 1,2-epoxy groups per molecule. In general, the polyepoxide compound is a saturated or unsaturated aliphatic, cycloaliphatic, aromatic or heterocyclic compound which possesses more than one 1,2-epoxy group. The polyepoxide compound can be substituted with one or more substituents which are nonreactive with the isocyanate groups such as lower alkyls and halogens. Such polyepoxide compounds are well known in the art. Illustrative polyepoxide compounds useful in the practice of the present invention are described in the *Handbook of Epoxy Resins* by H. E. Lee and K. Neville published in 1967 by McGraw Hill, New York, and U.S. Pat. No. 4,066,628.

Examples of suitable aromatic polyepoxides are bisphenol-A, bisphenol-F, bisphenol-AD, bisphenol-S, tetramethylbisphenol-A, tetramethylbisphenol-F, tetramethylbisphenol-AD, tetramethylbisphenol-S, tetrabromobisphenol-A, tetrachlorobisphenol-A, biphenols such as 4,4'-biphenol or 3,3',5,5'-tetramethyl-4,4'-biphenol, and dihydroxynaphthalene.

Examples of suitable aliphatic polyepoxides are diglycidyl esters of hexahydrophthalic acid and diglycidyl esters of dicarboxylic acids, epoxidized polybutadiene, epoxidized soybean oil, and epoxidized diols such as D.E.R. 736 and D.E.R. 732 available from The Dow Chemical Company.

Cycloaliphatic epoxides include, for example, 3,4-epoxy-6-methylcyclohexyl carboxylate and 3,4-epoxycyclohexyl carboxylate.

Preferred polyepoxides are glycidyl compounds of bisphenol-A, of bisphenol-F, of tetrabromobisphenol-A and of 3,3',5,5'-tetramethyl-4,4-biphenol. Mixtures of any two or more polyepoxides can also be used in the practice of the present invention.

The polyisocyanate compound useful in the practice of the present invention may be represented by the following general formula:

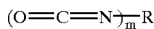

wherein R is substituted or unsubstituted aliphatic, aromatic or heterocyclic polyvalent group and m has an average value of from about 1.8 to about 2.2. Examples of suitable polyisocyanates are the difunctional isocyanates disclosed in WO A 9521879. Preferred examples are 2,4'-methylene bis(phenylisocyanate) and 4,4'-methylene bis (phenylisocyanate) (MDI) and isomers thereof, higher functional homologs of MDI (commonly designated as "polymeric MDI"), toluene diisocyanate (TDI) such as 2,4-toluene diisocyanate and 2,6-toluene diisocyanate, m-xylylene diisocyanate, hexamethylene diisocyanate (HMDI) and isophorone diisocyanate. Particularly preferred polyisocyanates are 2,4'-methylene bis(phenylisocyanate) and 4,4'-methylene bis(phenylisocyanate). Mixtures of any two or more polyisocyanates can also be used.

A suitable catalyst may be employed to facilitate reaction of the polyepoxide compound with the polyisocyanate compound. Examples of suitable catalysts include zinc carboxylate, organozinc chelate compound, trialkyl aluminum, quaternary phosphonium and ammonium salts, tertiary amines and imidazole compounds. The preferred catalysts are imidazole compounds and azo compounds. Particularly, preferred catalysts are 2-phenylimidazole 2-methylimidazole, 1-methylimidazole, 2-methylimidazole, 4,4'-methylene methylimidazole), 1,5-diazabicyclo[4.3.0] non-5-en, 1,4-diazabicyclo[2.2.2]octane and 1,8-diazabicyclo[5.4.0]undec-7-en.

The catalyst is generally employed in an amount of from about 0.01 to about 2; preferably from about 0.02 to about 1, most preferably from about 0.02 to about 0.5, weight percent based on the combined weight of the polyepoxide compound and polyisocyanate compound used.

The polyisocyanate compound is generally employed in an amount of from about 15 to about 43, preferably from about 20 to about 43, more preferably from about 20 to about 40, most preferably from about 25 to about 35, weight percent, based on the polyepoxide and polyisocyanate reactants.

The polyepoxide compound is generally employed in an amount of from about 85 to about 57, preferably from about 80 to about 57, more preferably from about 80 to about 60, most preferably from about 75 to about 65, weight percent, based on the polyepoxide and polyisocyanate reactants.

The reaction of the polyepoxide with the polyisocyanate is usually conducted at a temperature of from about 100° C. to about 240° C., preferably from about 120° C. to about 230° C., more preferably from about 130° C. to about 220° C., most preferably from about 140° C. to about 210° C.

The polyoxazolidone-containing resins can be produced via either a batch reactor or an extruder. The extrusion products exhibit lower polydispersity and higher molecular weight as compared with the batch reactor-produced materials. In particular, if it is desired to make a film, the extruder method is preferable. The residence time in an extruder depends on the temperature of the extrusion, the size of the extruder and the catalyst levels.

In the production of oxazolidone ring-containing resins via a batch reactor, the catalyst is usually added to the reaction vessel containing the polyepoxide prior to the start of the addition of polyisocyanate compound. The catalyst can be dissolved in a suitable solvent prior to the addition of the catalyst to the polyepoxide to improve homogenization if desired. The temperature at which the catalyst is added is not critical. In general, the catalyst is added at a temperature lower than the reaction temperature. The temperature is then raised and the reaction temperature maintained while the controlled addition of the polyisocyanate to the mixture of the catalyst and the polyepoxide is started. The polyisocyanate addition time will depend on the physical characteristics of the reactor, for example, stirrer size, and heat transfer characteristics, but usually, the polyisocyanate is added to the reaction vessel within a period of time of from about 3 to about 300, preferably from about 5 to about 240, more preferably from about 10 to about 180, most preferably from about 20 to about 150 minutes, while maintaining the reaction temperature. The reaction temperature is maintained after the complete addition of the polyisocyanate for a period of time of from about 5 to about 180, preferably from about 15 to about 120, most preferably from about 30 to about 90 minutes.

In general, the reaction of the polyepoxide compound and the polyisocyanate compound is preferably conducted neat, that is, in the absence of a solvent or other liquid reaction diluent, although the reaction may be carried out in the presence of a polar solvent such as dimethylforamide (DMF), N-methylpyrrolidone (NMP) and dimethylsulfoxide (DMSO).

The optional chain extender employed in the production of the polyoxazolidone compound is one which is able to increase the molecular weight of the polyoxazolidone compound. Preferred chain extenders are dihydric phenols, halogenated dihydric phenols, dicarboxylic acids, diamines, aminoamides and alkanolamines.

Suitable dicarboxylic acid chain extenders are compounds of the formula

R—(COOH)$_u$ wherein R is a $C_1$–$C_{40}$ hydrocarbyl moiety optionally containing oxygen along the backbone, and u is from about 1.8 to about 2.2. Examples are succinic acid, glutaric acid, adipic acid, phthalic acid, hexahydrophthalic acid, maleic acid, citraconic acid, itaconic acid, dodecenylsuccinic acid and alkylated endoalkylenetetrahydrophthalic acid, and half esters obtained from the reaction of a polyol with an acid anhydride.

The term "hydrocarbyl" as employed herein means any aliphatic, cycloaliphatic, aromatic, aryl-substituted aliphatic or cycloaliphatic, or aliphatic or cycloaliphatic-substituted aromatic groups.

Other suitable chain extenders useful in the practice of the present invention are diamines and aminoamides, that is, amine- or aminoamide-containing compounds having two N—H bonds capable of reacting with an epoxy group. Such compounds useful in the present invention include, for example, di-secondary amines of the general formula R—NH—R″—NH—R″ wherein R, R′ and R″ are alkyl, cycloalkyl or aryl moieties; and heterocyclic di-secondary amines wherein one or both of the N atom is part of a nitrogen-containing heterocyclic compound such as:

HN⁀R—NH—R″;  HN⁀R—R″—R⁀NH;

-continued

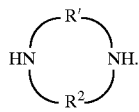

For reactivity reasons, and in order to control the epoxy advancement reaction with the difunctional amines more effectively, di-secondary amines or primary amines having sterically hindered amine groups are preferred as for example 2,6-dimethylcyclohexylamine or 2,6-xylidene (1-amino-2,6-dimethylbenzene).

Amino amide-containing compounds useful as chain extenders in the present invention include for example derivatives of carboxylic acids and carboxylic acid amides as well as derivatives of sulfonic acid amides, having additionally one primary or two secondary amino groups. Preferred examples of such compounds are amino-aryl carboxylic acid amides and amino-arylsulfonamides. A preferred compound of this group is, for example, sulfanilamide (4-aminobenzylsulfonic acid amide).

Other suitable examples are piperazine and substituted piperazine such as 2-methyl piperazine, monoethanolamine, and piperidin-4-carbonic acid.

The chain extender is particularly preferably a phenolic compound, containing on average more than about 1 and less than about 3, preferably from about 1.8 to about 2.2 and more preferably about 2 active hydrogen (for example, phenolic hydroxyl) groups per molecule.

The most preferred chain extenders are dihydroxy phenols. Non-limitative examples of the phenol compounds are 2,2-bis(3,5-dibromo-4-hydroxyphenyl)propane; 2,2-bis(4-hydroxyphenyl)propane; 2,2-bis(3,5-dichloro-4-hydroxyphenyl)propane; bis(4-hydroxyphenyl)methane; 1,1 bis(4-hydroxyphenyl)-1-phenyl ethane; 1,1′-bis(2,6-dibromo-3,5-dimethyl-4-hydroxyphenyl)propane; bis(4-hydroxyphenyl) sulfone; bis(4-hydroxyphenyl) sulfide; resorcinol, hydroquinone, tetramethylbisphenol-A, tetramethylbisphenol-AD and tetramethylbisphenol-S. Preferred dihydroxyphenolic compounds are 2,2-bis(4-hydroxyphenol)propane (bisphenol-A), and 2,2-bis(4-hydroxy-3,5-dibromophenyl)propane.

When the phenolic chain extender is non-halogenated, its molecular weight is preferably at least about 110 and more preferably at least about 185. The molecular weight is preferably no more than about 800, more preferably no more than about 500, and most preferably no more than about 250. For halogenated phenolic chain extenders, the formula weight of non-halogen atoms in the chain extender preferably meets the foregoing preferred limitations, and the total molecular weight is preferably within the preferred embodiments plus the formula weight of the halogen.

The quantity of chain extender employed in the production of the adhesive resin material is preferably such that the equivalent ratio of epoxy compound to chain extender is from about 1.5 to about 0.85, preferably from about 1.3 to about 0.9, more preferably from about 1.2 to about 0.95.

The polyoxazolidone compounds are used in accordance with the present invention as an adhesive to improve the peel strength of a metallic layer, in particular of copper and copper-based alloy materials onto a core laminate, for example, onto a glass fiber-reinforced epoxy or the dielectric carrier layer through the use of heat and pressure upon lamination, and to improve the viscosity characteristics of curable thermosetting resin formulations such as epoxy resins, in particular in the manufacture of prepregs and laminates, in particular electrical laminates. The compositions may also be used in encapsulation, coating and structural composite applications.

The thermosetting resin into which the oxazolidone-containing resins is incorporated is preferably an epoxy resin, more preferably a diglycidyl ether of bisphenol-A or a diglycidyl ether of a halogenated bisphenol-A. Other useful low-viscosity epoxy resins are glycidyl ether derivatives of 1,1,1-tris-(hydroxyphenyl)-alkanes and halogenated variations thereof. Examples of suitable epoxy resins and processes to make them are also described in H. Lee & K. Neville, *Handbook of Epoxy Resins* at 2-1 to 3-20 (McGraw-Hill Book Co. 1967).

The epoxy resin is generally an epoxy-terminated resin having a molecular weight of from about 200 to about 3000, and may incorporate flame-retardant groups, for example, halogen (for example, bromine or chlorine) or phosphorous, in the resin.

In particular, the epoxy resin may be, for example, a resin derived from the reaction of a polyepoxide with a polyisocyanate, and having an molecular weight of from about 200 to about 3000 (for example, as described in U.S. Pat. No. 5,112,932).

The formulation may comprise a low viscosity resin and low solvent content, as described in WO A 9612751.

The formulation may furthermore comprise styrene maleic acid anhydride copolymer as hardener, in order to provide low dielectric constant properties, as disclosed in PCT/US98/01041.

The formulation may also comprise a boron-containing compound, for example boric acid or a boron oxide, as a cure inhibitor, as disclosed in GB A 0458502.

The heat-curable thermosetting resin preferably further contains a hardener (otherwise known as a "curing agent"). Suitable hardeners are multifunctional cross-linkers. Such multifunctional cross-linkers are described in numerous references, such as, Vol. 6, Encyclopedia of Poly. Sci. & Eng., "Epoxy Resins," at 348-56 (J. Wiley & Sons 1986). Multifunctional cross-linkers (as opposed to catalysts and chain extenders) preferably contain on average more than two active hydrogen moieties per molecule. For instance, the cross-linker preferably contains a plurality of secondary amine groups, one or more primary amine groups, more than 2 phenolic hydroxyl groups, a plurality of primary amide groups or more than two carboxylic acid groups.

Examples of suitable multifunctional cross-linkers known to be useful as hardeners for epoxy resins, include polyamines, polyamides, polyanhydrides, polyphenols and polyacids that contain more than two reactive sites per molecule on average. Preferred examples of multifunctional cross-linkers include dicyandiamide and polyphenols such as novolacs. Examples of other multifunctional cross-linkers which can be used include polyanhydrides as disclosed, for example, in WO A 9411415 (published May 26, 1994).

The quantity of multifunctional cross-linker is preferably from about 0.1 to about 200 parts by weight, per hundred parts by weight of the resin composition. When the multifunctional cross-linker is dicyandiamide, the formulation preferably contains from about 0.5 to about 8 parts by weight of dicyandiamide per hundred parts of the resin composition. The polyanhydrides are preferably used in an amount of from about 2 to about 200 parts, per hundred parts of the resin composition.

The epoxy resin composition according to the present invention may optionally contain other additives of a generally conventional type, such as stabilizers, flame retardants, organic or inorganic fillers, pigments, wetting agents and flexibilizers such as polybutadiene and polystyrene-butadiene co-polymer. Examples of suitable additives are described in U.S. Pat. No. 5,066,735 and in C.A. Epoxy Resins-Second Ed. at 506–512 (Mercel Dekker, Inc., 1988). Particular examples of additives are methyl-toluene-4-sulfonate, aluminum oxides, phosphonic acid ester (such as Amgard P45 supplied by Albright and Wilson Ltd. United Kingdom), and talc.

A typical epoxy resin in accordance with the present invention is as follows:

|  | PERCENT BY WEIGHT |
|---|---|
| Solvent | 0–70 |
| Pigment | 0–10 |
| Filler | 0–20 |
| Stabilizer | 0.01–2 |
| Hardener | 0.1–60 |
| Catalyst | 0.01–5 |
| Chain extender | 0–50 |
| Oxazolidone-containing resin | 1–99 |
| Epoxy resin | 20–99 |

The formulations previously described may be used to coat the copper foil, make films, bonding sheets and electrical laminates.

Preferred embodiments of the invention are illustrated in the following specific Examples. In the Examples, references to "D.E.R." resins refer to resins produced by The Dow Chemical Company under the respective designation.

Preparation 1—General Production Procedure for Oxazolidone Ring-containing Polyepoxy/polyisocyanate Copolymer An epoxy resin (D.E.R. 330) was heated to 100° C. under nitrogen purge in a 1-liter flange-top glass reactor equipped with an electrically driven mechanical stirrer, air and nitrogen inlets, sample port, condenser and thermocouple.

1500 ppm based on the "total solids" (that is, epoxy plus isocyanate) of a reaction catalyst (1,8-diazabicyclo(5.4.0) undec-7-en, a commercial product obtainable from Anchor under the Trademark AMICURE DBU-E) was added and the mixture was heated to about 150° C. (for MDI) or about 180° C. (for TDI).

An isocyanate (as described in Table I) was charged into the epoxy resin via an additional funnel portion-wise within a period of about 5 minutes to about 240 minutes.

The heat of reaction caused the reaction temperature to rise to at least about 190° C. to about 210° C. The reaction temperature was maintained between about 200° C. and about 205° C. until all the isocyanate was added. After addition was complete, the reaction mixture was kept at about 200° C. for about 5 minutes to about 60 minutes until the theoretical epoxy equivalent weight (EEW) was reached. The solid resin was diluted with DMF to about 50 to about 55 weight percent solid solution and cooled to room temperature.

Preparation 2—General Production Procedure for an Oxazolidone Ring-containing Resin Incorporating a Chain Extender Epoxy/isocyanate copolymers produced in accordance with "Preparation 1" above were introduced as a charge into a 1-liter flange-top glass reactor equipped with an electrically driven mechanical stirrer, air and nitrogen inlets, sample port, condenser and thermocouple.

A chain extender (tetrabromobisphenol-A, bisphenol-A, or monoethanolamine) was added to the epoxy/isocyanate copolymer solution and additional solvent was added to make a 35 weight percent solid solution.

When a bisphenol chain extender was used, an additional advancement catalyst (triphenylethyl phosphonium acetate) was added to the solution. The reaction mixture was heated to about 120° C. to about 135° C. The temperature of the reaction mixture was maintained in this range over a period of about 2 hours to about 24 hours until the epoxy content of the product was lower than 1 percent.

When an amine chain extender was used, the reaction temperature was between about 60° C. to about 100° C. and no additional catalyst was needed.

The reaction mixture was cooled to room temperature, and additional solvent was added to adjust the solid content to about 30 or about 40 weight percent.

EXAMPLES 1 TO 6

Polyoxazolidone compositions were prepared, using the general method "Preparation 1" outlined above, and the ingredients and amounts set out in Table I.

The following analytical methods are used for various measurements in the Examples.

The standard wet titration method was used to determine Epoxy Equivalent Weight (EEW).

Reactivity of the resins was measured according to the following method: the resin solution was blended with catalyst and hardened in amounts as shown in Table III and Table IX. The mixture was then reacted on the surface of a hot plate, and reactivity was reported as elapsed time required for gelation.

The glass transition temperature (Tg) of the resin was measured by differential scanning calorimetry (DSC) at 10° C./minute, from about 0° C. to about 150° C.

The melt viscosity was measured according to the ASTM D445 method using an ICI cone and plate viscometer.

Weight average molecular weight (Mw) was measured by gas phase chromatography (GPC) using DMF as solvent.

Physical properties of the compositions are also shown in Table I.

TABLE I

| | Example 1 | Example 2 | Example 3 | Example 4 | Example 5 | Comparative Example 1 | Comparative Example 2 |
|---|---|---|---|---|---|---|---|
| COMPOSITION (parts by weight) | | | | | | | |
| PKHH (from Phenoxy Associate Co.) | | | | | | | 100 |
| EPOXY RESIN A$^{(1)}$ | 70 | 68 | 69 | 69.5 | 78 | 81 | |
| ISOCYANATE A$^{(2)}$ | 30 | 32 | | 30.5 | | | |
| ISOCYANATE B$^{(3)}$ | | | 31 | | | | |
| ISOCYANATE C$^{(4)}$ | | | | | 22 | 19 | |
| DBU$^{(5)}$, (ppm) | 1500 | 1500 | 1500 | 1500 | 2000 | 2000 | |
| RESIN CHARACTERISTICS | | | | | | | |
| EEW | 669 | 817 | 716 | 721 | 600 | 435 | >10000 |
| MELT VISCOSITY @ 200° C. (Pa · s) | 4.64 | 20.0 | 7.68 | 8.0 | 4.8 | 0.53 | Not measurable |
| Tg (° C.) | 93 | 105 | 91 | 96 | 86 | 60 | 95 |
| Mw | 5994 | 10807 | 7121 | 7821 | 7596 | 4564 | 59487 |

$^{(1)}$Epoxy Resin A is a diglycidyl ether of bisphenol-A having an epoxy equivalent weight between 177 and 189 sold by The Dow Chemical Company under the Trademark D.E.R. 330.
$^{(2)}$ISOCYANATE A is a mixture of 50/50 weight percent of 2,4'- and 4,4'-methylenebis(phenylisocyanate), sold by The Dow Chemical Company as an experimental product XZ95263.00
$^{(3)}$ISOCYANATE B is 4,4'-methylenebis(phenylisocyanate), sold by The Dow Chemical Company under the Trademark ISONATE M125
$^{(4)}$ISOCYANATE C is technical grade TDI (95 percent 2,4- and 5 percent 2,6-isomer) sold by Fluka, under the designation 89871
$^{(5)}$DBU is a catalyst for the epoxy/MDI reaction {1,8-diazabicyclo(5.4.0)undec-7-en}

Examples 1 to 5 each have a Tg of at least 86, which is generally comparable with that of PKHH.

Each of Examples 1 to 5 have a hydroxyl content which is, for practical purposes, 0. Comparative Example 1 is intended to illustrate the type of product obtained following the method disclosed in Example 6 of EP B 0695316, which uses TDI, in an amount of 18.7 percent, based on the total amount of TDI/epoxy resin (this being the highest amount of TDI suggested in the reference). It can be seen that the molecular weight of the resulting product is less than 5,000, and the melt viscosity and Tg values of the product are low. By comparison, Example 5 employs a larger amount of isocyanate (TDI) which results in a material having a higher molecular weight, and consequently a higher Tg.

EXAMPLES 6 TO 8

Advanced polyoxazolidone compositions were prepared, by reacting the polyoxazolidone compositions prepared in Examples 1, 3 and 4 with various chain extenders, namely bisphenol-A, or TBBA (tetrabromobisphenol-A), using the general method "Preparation 2" outlined above, and the ingredients and amounts set out in Table II. Physical properties of the compositions are also shown in Table II.

The Tg of the resulting materials are all higher than that of PKHH.

TABLE II

| COMPOSITION (part by weight) | Example 6 | Example 7 | Example 8 |
|---|---|---|---|
| Resin of Example 1 | 29.2 | | |
| Resin of Example 3 | | 29.2 | |
| Resin of Example 4 | | | 26.09 |
| TBBA | 10.8 | 10.8 | |

TABLE II-continued

| COMPOSITION (part by weight) | Example 6 | Example 7 | Example 8 |
|---|---|---|---|
| Bisphenol-A | | | 3.91 |
| DMF | 60 | 60 | 70 |
| Triphenylethylacetate | 0.04 | 0.03 | 0.09 |
| RESIN CHARACTERISTICS | | | |
| % epoxy (on solid) | 0.67 | 0.70 | 0.65 |
| Tg (° C.) | 130 | 137 | 131 |
| Hydroxyl content (Equiv/100 g solids) | 0.10 | 0.10 | 0.11 |

EXAMPLES 9–14

Comparative Examples 3–6

Formulation Examples Showing Copper Peel Strength Measurement

The resin formulation of Example 7 (hereinafter designated "Coating Composition D" or "Example 9"), a PKHH solution (30 weight percent in DMF, hereinafter designated "Coating Composition Reference 1" or "Comparative Example 3"), a mixture of the resin formulation of Example 7 and PKHH solution (50/50 weight percent based on solid, hereinafter designated "Coating Composition E" or "Example 13") and four other resin formulations containing the material produced in Example 2 (as shown in Table III) were coated onto standard copper foils having a thickness of 35 μm. The copper foils are available under the Tradename "NT-TW", were obtained from Circuit Foils, Luxembourg.

TABLE III

| COATING COMPOSITION (parts by weight) | Example 9 A | Example 10 B | Example 11 C | Example 14 F | Comparative Example 4 Reference 2 |
|---|---|---|---|---|---|
| Resins of Example 2 | 38 | 39 | 48.35 | 50 | |
| D.E.R. 537EK80 | | | | | 100 |
| Monoethanolamine | | | 1.65 | | |
| TBBA | 12 | | | | |
| D.E.R. 560 | | 21 | | | |
| DMF (weight percent) | 50 | 40 | 50 | 50 | |
| Dicyandiamide | | 1.32 | | 0.75 | 2.4 |
| 2-MI (weight percent) | 0.04 | 0.06 | | 0.04 | 0.08 |
| FORMULATION CHARACTERISTICS | | | | | |
| Gel time at 170° C. (seconds) | 177 | 307 | 149 | 289 | 214 |
| Tg (° C.) | 149 | 149 | 134 | 155 | 135 |

A coater was used to produce a thin film from each of the aforementioned resin formulations on the standard copper foil laid on a flat metal plate. The copper foil was partially dried in a hot air oven at 180° C. for 3 minutes, and then left in a vacuum oven at 35° C. for 60 minutes to completely dry the residual solvent. The thickness of the film varied from about 30 to about 70 μm.

The resin coated copper foils were laminated to prepregs by applying heat and pressure under standard conditions. The copper peel strength of the different coating formulations was evaluated, and the results are summarized in Table IV ("dicy" refers to dicyandiamide).

As comparative examples, the peel strength of standard un-coated copper foil "NT-TW" (Reference 4) and a commercially available treated copper foil "NTTWS" (Reference 3) having a 35 μm thickness grade, obtained from Circuit Foils were measured. The peel strength of the foils was measured by IPC method TM-650 Number 2.4.8C.

TABLE IV

| Example No. | Coated Resin type | Film thickness, μm | Anhydride cured system II (Tg = 175/185° C.) Copper peel strength, N/cm | Dicyandiamide cured system I (Tg = 149/147° C.) Copper peel strength, N/cm |
|---|---|---|---|---|
| Example 9 | Coating Composition A: Epoxy-MDI of Example 2/TBBA/2-MI | 58.5 | 21.7 | 22.1 |
| Example 10 | Coating Composition B: Epoxy-MDI of Example 2/D.E.R. 560/dicy/2-MI | 70.1 | 18.0 | 21.0 |
| Example 11 | Coating Composition C: Epoxy-MDI of Example 2 /Monoethanolamine | 48 | 18.1 | — |
| Example 12 | Coating Composition D: Epoxy-MDI/TBBA Example 7 | 39 | 22.4 | 22.6 |
| Example 13 | Coating Composition E: Example 7 + PKHH (50/50 weight percent) | 45.3 | 22.6 | 21.5 |
| Comparative Example 3 | Coating Composition Reference 1: PKHH | 36 | 24.9 | 27.7 |

TABLE IV-continued

| Example No. | Coated Resin type | Film thickness, μm | Anhydride cured system II (Tg = 175/185° C.) Copper peel strength, N/cm | Dicyandiamide cured system I (Tg = 149/147° C.) Copper peel strength, N/cm |
|---|---|---|---|---|
| Comparative Example 4 | Coating Composition Reference 2: D.E.R. 537/dicy/2-MI | 62.1 | 15.7 | 20.2 |
| Comparative Example 5 | Reference 3: Treated copper foil, NTWS, | not determined | 14.9 | 20.3 |
| Comparative Example 6 | Reference 4: Non-coated standard foil, NTW | 0 | 12.3 | 18.4 |

Table IV shows that it is possible to increase the copper foil adhesion by pre-coating the copper foil with the specified high Mw resins. High Tg laminates usually exhibit lower copper peel strength because of higher cross-linking density at the laminate/copper foil interface which reduces the adhesion of the copper foil to the core laminates. The pre-coating of the copper foils increases the adhesion of the high Tg laminate systems considerably (compare, for example, System II having Tg=175/185° C. with System I having Tg=149/147° C. for a comparable or improved Tg).

Although the copper peel strength measured for Coating Composition Reference 1 (PKHH) is higher than that of other coating systems, the Tg of PKHH is only 95° C. and it has a high level of hydroxyl group (approximately 0.33 equivalent/100 gm of solid resin) on the chemical backbone. It thus has higher polarity and higher dielectric constant.

Varnish compositions designated as Formulation I (dicy cured system) and Formulation II (styrene-maleic acid anhydride cured system) were used to make prepregs for copper peel strength measurements as follows:

Formulations I (Dicy Cured System)

Epoxy resin varnish compositions were prepared using the viscosity modifiers prepared according to Example 2 and the ingredients and amounts set out in Table V. The various components were mixed at room temperature, using a mechanical stirrer. Physical properties of the compositions are also shown in Table III.

"Epoxy Resin B" is a reaction product of a commercially available liquid epoxy resin having an EEW of 180 (D.E.R. 383), tetabromobisphenol-A (TBBA), a commercially available brominated epoxy resin having an EEW of 441 (D.E.R. 560), and a catalyst (triphenylethyl phosphonium acetate) mixed in the following proportions (parts by weight):

| | |
|---|---|
| D.E.R. ™ 383 | 51.60 |
| TBBA | 22.00 |
| D.E.R. ™ 560 | 6.40 |
| catalyst (based on solid) | 500 ppm |
| EEW = 363 | |
| Glycol ether (DOWANOL PM, Trademark of The Dow Chemical Company) | 10.00 |
| Acetone | 8.80 |
| Boric acid solution (20 weight percent in methanol) | 1.20 |
| TOTAL | 100.00 |

Stroke cure reactivity at 170° C. was measured by stroking the formulation onto a hot plate at 170° C., and measuring the time taken for the composition to gel.

TABLE V

Weight ratio of components (based on solids) for Formulation I

| EPOXY RESIN FORMULATION | Formulation I* |
|---|---|
| Epoxy Resin B | 100.00 |
| Dicyandiamide [10% solid in DOWANOL PM ™/DMF] | 3.00 |
| (TPE) (SD-357B) Solution. [50% in MEK] (from Borden Chemicals) | 0.80 |
| Glycidyl ether of TPE (EPON 1031 ™) [69.7% Solid in Acetone] | 2.00 |
| Material of Example 2 (50% solid in DMF) | 3.00 |
| 2-Phenylimidazole (20% solid in methanol) | 0.47 |
| TOTAL (on a solids basis) | 109.27 |
| MEK solvent to make up 60.0% solids | |
| Stroke Cure Reactivity at 170° C. (seconds) | 277–281 |

*Components of Formulation I are given on a solids basis.

Formulation II (Styrene-maleic Anhydride Copolymer as Curing Agent (Hardener)

Compositions were prepared using styrene/maleic anhydride copolymer as an epoxy hardener. The different components are summarized in the following Table VI. "Epoxy Resin C" has the following composition (parts by

| | |
|---|---|
| D.E.R. ™ 330 | 19.452 |
| D.E.R. ™ 560 | 25.352 |
| TBBA | 11.196 |
| TOTAL | 56.000 |

To prepare Epoxy Resin C, the 3 components listed above were blended at 130° C. for 1 hour, and the solids were dissolved in DOWANOL™ PMA to give a solution containing 85 percent solids.

The styrene/maleic anhydride copolymer was SMA 3000, available from ELF ATOCHEM.

The catalyst/inhibitor was a mixture of 2-ethyl,4-methyl imidazole and boric acid, in a weight ratio of 5:4 (20 percent solids in methanol).

TABLE VI

Weight Ratio of Components (based on solids)

| Components | Formulation II |
|---|---|
| SMA 3000 (F) ™ (50% solid in DMF) | 44.000 |
| Epoxy Resin C (85% solid in DOWANOL ™ PMA) | 56.000 |
| Catalyst/inhibitor | 0.090 |
| MEK solvent to make up solution containing 60.0% solids | |
| TOTAL | 100.090 |
| Stroke Cure Reactivity at 170° C. seconds-Day 1 | 184–188 |
| Stroke Cure Reactivity at 170° C. seconds-Day 2 | 170–174 |
| Stroke Cure Reactivity at 170° C. seconds-Day 3 | 162–166 |

Preparation of Prepregs

Prepregs were prepared from Formulations I and II by dipping, using a glass cloth substrate (Type 7628 from Porcher Textile, Badinieres, Fr-38300 Bourgoin-Jallieu France, or Interglas Textil GmbH, Ulm/Donau, Germany). The impregnated substrates were passed through a CAR-ATSCH™ pilot treater (built by Caratsch AG, Bremgarten, Switzerland) having a 3-meter horizontal oven, at an air temperature of approximately 179° C. for Formulation I and approximately 163° C. for Formulation II, and a winding speed of from 1.3 m/minute for Formulation I and 1.05 m/minute for Formulation II.

The resin content of each prepreg was measured using 10 cm by 10 cm square sheets of glass cloth before and after prepreg production, according to Method IPC-L-109B, IPC-TM-650:2.3.16 (available from the Institute for Interconnecting and Packaging Electronic Circuits, Lincolnwood, Ill., USA.) The results are shown in Tables VII and VIII.

TABLE VII

| | Formulation I |
|---|---|
| Set Temperature (° C.) | 183 |
| Air Temperature (° C.) | 179 |
| Gap | 54 |
| Winding Speed (m/minute) | 1.3 |
| Resin content (weight percent) | 46.1 |
| Gel-time (seconds) | 114 |
| MIL Flow (%) | 25.0 |
| Minimum Viscosity @ 140° C. (Pa · s) | 51.84 |

TABLE VIII

| | Formulation II |
|---|---|
| Oil (° C.) | 241 |
| Set Temperature (° C.) | 175 |
| Air Temperature (° C.) | 163 |
| Gap | 49 |
| winding Speed (m/minute) | 1.05 |
| Resin content (weight percent) | 46.8 |
| Gel-time (seconds) | 30 |
| MIL Flow (%) | 25.4 |

Preparation of Laminates

Eight sheets of each prepreg were laid-up in alternating layers with sheets of copper foil, according to the following press cycle. The laid-up prepregs were cured according to the following temperature and profile:

Formulation I Press Cycle

| | |
|---|---|
| Start Temperature: | 40° C. |
| Plateau Temperature: | 180° C. |
| Heat-up Ramp Duration: | 70 minutes |
| Plateau Time: | 40 minutes |
| Cooling to Room Temperature Time: | 50 minutes |
| Vacuum duration: | 30 min |
| Low Pressure: | 40° C. to 110° C. 25 KN/900 cm$^2$) |
| High Pressure: | 110° C.-end of cycle (40KN/900 cm$^2$) |

Formulation II Press Cycle

| | |
|---|---|
| Start Temperature: | 40° C. |
| Plateau Temperature: | 200° C. |
| Heat up Ramp Rate: | 3° C./minutes |
| Plateau Time: | 90 minutes |
| Cooling to Room Temperature Time: | 50 minutes |
| Vacuum Duration: | 30 minutes |
| Pressure: | 120 KN/900 cm$^2$ |

The following tests were performed on each cured laminate:

(a) N-methylpyrrolidone (NMP) pick-up was measured by weighing a 5 cm by 5 cm sheet of laminate, immersing it in NMP at 23° C. for 30 minutes, and then re-weighing. The results are expressed as a percent gain.

(b) Laminate glass-transition temperature was measured using a differential scanning calorimeter (DSC), scanning from about 50° C. to about 220° C. at 10° C. per minute. The results are expressed in 0° C. The same laminate sample was run twice, to obtain Tg I and Tg II.

(c) Water resistance was measured by putting the laminates in a pressure cooker for 120 minutes according to Method IPC-A-600, IPC-MI-660 and IPC-TM-650:2.6.16. All of the laminates passed the pressure cooker test. Water pick-up was measured.

| Laminate Properties | Laminate System I |
|---|---|
| Tg I/II (° C.) (fresh prepreg) | 149/147 |
| Water pick-up (weight percent) | 0.49 |
| NMP pick-up (weight percent) | 0.11 |

| Laminate Properties | Laminate System II |
|---|---|
| Tg I/II (° C.) (fresh prepreg) | 178/185 |
| Water pick-up (weight percent) | 0.19 |
| Standard Copper (NT-TW) peel Strength (N/cm) | 12.5 |
| Treated Copper (NTTWS) peel strength, (N/cm) | 15.7 |

What is claimed is:

1. A coated metallic foil comprising a metallic foil having an adhesive coating of a resin composition coated on the surface of said metallic foil; said resin composition comprising from about 1 to about 100 weight percent of a thermoplastic oxazolidone ring-containing compound having a molecular weight of at least 5000, which is the reaction product of:

a) from about 20 to about 43 weight percent of a polyisocyanate having an isocyanate-functionality of from about 1.8 to about 2.2, and b) from about 80 to about 57 weight percent of a polyepoxide having an epoxide functionality of about 1.8 to about 2.2, and optionally, c) a chain extender, wherein said weight percent quantities are based on the total weight of the polyisocyanate and the polyepoxide reactants.

2. The metallic foil as claimed in claim 1, wherein the polyepoxide used for the preparation of the adhesive resin is:

i) an aromatic polyepoxide, selected from bisphenol-A, bisphenol-F, bisphenol-AD, bisphenol-S, tetramethyl bisphenol-A, tetramethyl bisphenol-F, tetramethyl bisphenol-AD, tetramethyl bisphenol-S, tetrabromobisphenol-A, tetrachlorobisphenol-A, 4,4'-biphenol, 3,3',5,5'-tetramethyl-4,4'-biphenol, and dihydroxynaphthalene;

ii) an aliphatic polyepoxide selected from a diglycidyl ester of hexahydrophthalic acid, a diglycidyl ester of a dicarboxylic acid, an epoxidized polybutadiene, an epoxidized soybean oil, and an epoxidized diol;

iii) a cycloaliphatic epoxide, selected from 3,4-epoxy-6-methylcyclohexyl carboxylate and 3,4-epoxycyclohexyl carboxylate; or iv) a mixture of two or more thereof.

3. The metallic foil as claimed in claim 2, wherein the polyepoxide used for the preparation of the adhesive resin is a glycidyl compound of bisphenol-A, a glycidyl compound of bisphenol-F, a glycidyl compound of tetrabromobisphenol-A, a glycidyl compound of 3,3',5,5'-tetramethyl-4,4-biphenol, or a mixture of two or more thereof.

4. The metallic foil as claimed in claim 1, wherein the polyisocyanate compound used for the preparation of the adhesive resin is a compound of the general formula:

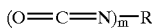

wherein R is a substituted or unsubstituted aliphatic, aromatic or heterocyclic polyvalent group and m has an average value of from about 1.8 to about 2.2.

5. The metallic foil as claimed claim 4, wherein the polyisocyanate compound used for the preparation of the adhesive resin is a 2,4'-methylene bis(phenylisocyanate), 4,4'-methylene bis(phenylisocyanate) (MDI) or an isomer thereof, a higher functional homolog of MDI, a toluene diisocyanate (TDI), m-xylylene diisocyanate, hexamethylene diisocyanate (HMDI), isophorone diisocyanate, or a mixture of two or more thereof.

6. The metallic foil as claimed in claim 5, wherein the polyisocyanate compound used for the preparation of the adhesive resin is 2,4'-methylene bis(phenylisocyanate), 4,4'-methylene bis(phenylisocyanate), a toluene diisocyanate (TDI)or a mixture thereof.

7. The metallic foil as claimed in claim 1, wherein the reaction of the polyepoxide compound with the polyisocyanate compound is carried out in the presence of a catalyst, which is zinc carboxylate, an organozinc chelate compound, a trialkyl aluminum salt, a quaternary phosphonium salt, a quaternary ammonium salt, a tertiary amine or an imidazole, or a mixture of two or more thereof.

8. The metallic foil as claimed in claim 7, wherein the catalyst is 2-phenylimidazole 2-methylimidazole, 1-methylimidazole, 4,4'-methylene methylimidazole), 1,5-diazabicyclo [4.3.0]non-5-en, 1,4-diazabicyclo[2.2.2]octane, 1,8-diazabicyclo[5.4.0]undec-7-en, or a mixture of two or more thereof.

9. The metallic foil as claimed claim 1, wherein the chain extender employed in the production of the polyoxazolidone compound is a dihydric phenol, a halogenated dihydric phenol, a dicarboxylic acid, a diamine, an aminoamide an alkanolamine, or a mixture of two or more thereof.

10. The metallic foil as claimed in claim 9, wherein the chain extender is succinic acid, glutaric acid, adipic acid, oxalic acid, phthalic acid, hexahydrophthalic acid, maleic acid, citraconic acid, itaconic acid, dodecenylsuccinic acid, an alkylated endoalkylenetetrahydrophthalic acid, a half ester obtained from the reaction of a polyol with an acid anhydride, a di-secondary amine of the general formula R—NH—R''—NH—R'' wherein R, R' and R'' are each a $C_1$–$C_{10}$ alkyl, $C_1$–$C_{20}$ cycloalkyl or $C_5$–$C_{20}$ aryl moiety, a heterocyclic di-secondary amines wherein one or both of the N atom is part of a nitrogen containing heterocyclic ring, of the general formula

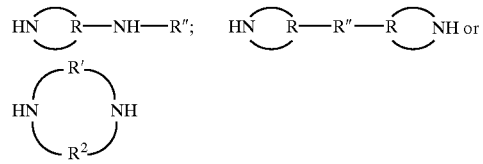

an aminoaryl carboxylic acid amide, an aminoarylsulfonamide, piperazine 2-methyl piperazine, monoethanolamine, piperidine-4-carbonic acid, 4-aminobenzylsulfonic acid amide, or a phenolic compound containing on average more than about 1 and less about 3 phenolic hydroxyl groups per molecule.

11. The metallic foil as claimed in claim 10, wherein the chain extender is 2,2-bis(3,5-dibromo-4-hydroxyphenyl) propane; 2,2 -bis(4-hydroxyphenyl)propane; 2,2-bis(3,5-dichloro-4-hydroxyphenyl)propane; bis(4-hydroxyphenyl) methane; 1,1-bis(4-hydroxyphenyl)-1-phenylethane; 1,1'-bis(2,6-dibromo-3,5-dimethyl-4-hydroxyphenyl)propane; bis(4-hydroxyphenyl)sulfone; bis(4-hydroxyphenyl)sulfide; resorcinol, hydroquinone, tetramethylbisphenol-A, tetramethylbisphenol-AD or tetramethylbisphenol-S.

12. The metallic foil as claimed claim 1, wherein the chain extender employed in the production of the polyoxazolidone compound has a molecular weight (excluding any halogen present) of from about 110 to about 800.

13. The metallic foil as claimed in claim 12, wherein the chain extender employed in the production of the polyoxazolidone compound has a molecular weight (excluding any halogen present) of from about 185 to about 500.

14. The metallic foil as claimed in claim 1, wherein the reaction of the polyepoxide compound with the polyisocyanate compound is carried out in the presence of a cross-linker which is a polyamine, polyaimide, a polyanhydride, a polyphenol or a polyacid, that contains an average of more than two reactive sites per molecule.

15. The metallic foil as claimed in claims 14, wherein the cross-linker is dicyandiamide, a polyanhydride or a polyphenol.

16. The metallic foil as claimed in claim 1, wherein the resin composition comprises, in addition to the polyoxazolidone compound, a) from 0–99 weight percent of a thermosetting resin;

b) from 0–99 weight percent of a thermoplastic resin; or c) from 0–99 weight percent of a mixture of a thermosetting resin and a thermoplastic resin.

17. A method of adhering a metallic foil to a prepreg or laminate, which method comprises coating the metallic foil with an adhesive resin composition comprising from about 1 to about 100 weight percent of a thermoplastic oxazolidone ring-containing compound having a molecular weight of at least 5000, which is the reaction product of:
- a) from about 20 to about 43 weight percent of a polyisocyanate having an isocyanate-functionality of from about 1.8 to about 2.2, and
- b) from about 80 to about 57 weight percent of a polyepoxide having an epoxide functionality of about 1.8 to about 2.2, and optionally,
- c) a chain extender, wherein said weight percent quantities are based on the total weight of the polyisocyanate and the polyepoxide reactants; and then contacting the coated side of the foil to the prepreg or laminate.

18. A bonding sheet for use in bonding a metallic foil to a prepreg or laminate, which comprises a reinforcing web, which is impregnated with a resin composition comprising from about 1 to about 100 weight percent of a thermoplastic oxazolidone ring-containing compound having a molecular weight of at least 5000, which is the reaction product of:
- a) from about 20 to about 43 weight percent of a polyisocyanate having an isocyanate-functionality of from about 1.8 to about 2.2, and
- b) from about 80 to about 57 weight percent of a polyepoxide having an epoxide functionality of about 1.8 to about 2.2, and optionally,
- c) a chain extender, wherein said weight percent quantities are based on the total weight of the polyisocyanate and the polyepoxide reactants.

19. An adhesive film for used in bonding a metallic foil to a prepreg or a laminate, wherein the film is composed of a resin composition comprising from about 1 to about 100 weight percent of a thermoplastic oxazolidone ring-containing compound having a molecular weight of at least 5000, which is the reaction product of:
- a) from about 20 to about 43 weight percent of a polyisocyanate having an isocyanate-functionality of from about 1.8 to about 2.2, and
- b) from about 80 to about 57 weight percent of a polyepoxide having an epoxide functionality of about 1.8 to about 2.2, and optionally,
- c) a chain extender, wherein said weight percent quantities are based on the total weight of the polyisocyanate and the polyepoxide reactants.

20. A prepreg or a laminate having a metallic foil bonded to a surface thereof, with an adhesive resin composition comprising from about 1 to about 100 weight percent of a thermoplastic oxazolidone ring-containing compound having a molecular weight of at least 5000, which is the reaction product of:
- a) from about 20 to about 43 weight percent of a polyisocyanate having an isocyanate-functionality of from about 1.8 to about 2.2, and
- b) from about 80 to about 57 weight percent of a polyepoxide having an epoxide functionality of about 1.8 to about 2.2, and optionally,
- c) a chain extender, wherein said weight percent quantities are based on the total weight of the polyisocyanate and the polyepoxide reactants.

21. A printed wiring board formed from a prepreg or a laminate as claimed in claim 20.

* * * * *